United States Patent [19]

Ivas

[11] 3,906,257

[45] Sept. 16, 1975

[54] NOISE IMMUNITY CIRCUIT FOR USE WITH REMOTE CONTROL RECEIVER

[75] Inventor: Thomas W. Ivas, Evergreen Park, Ill.

[73] Assignee: Quasar Electronics Corporation, FRanklin Park, Ill.

[22] Filed: Dec. 17, 1973

[21] Appl. No.: 425,355

[52] U.S. Cl. ................ 307/231; 307/255; 307/229; 328/127; 328/165

[51] Int. Cl. ............................................ H03k 17/00

[58] Field of Search ........... 325/309, 313, 314, 473, 325/474, 392; 328/165, 127; 307/246 R, 229 A, 230, 234; 330/141

[56] References Cited

UNITED STATES PATENTS

| | | | |
|---|---|---|---|
| 2,799,737 | 7/1957 | Rich | 330/141 |
| 3,021,489 | 2/1962 | Nielsen | 330/141 |
| 3,218,558 | 11/1965 | Kieffer | 325/392 |
| 3,514,639 | 5/1970 | Gundlach et al. | 307/246 |
| 3,555,301 | 1/1971 | Hansen | 307/246 |
| 3,699,357 | 10/1972 | Lloyd | 328/146 |

*Primary Examiner*—Michael J. Lynch
*Assistant Examiner*—B. P. Davis
*Attorney, Agent, or Firm*—La Valle D. Ptak

[57] ABSTRACT

A noise-immunization circuit arrangement for remote control apparatus included as part of an electronic receiver, such as a television set. The circuit arrangement includes a pair of capacitor integrator circuits at the output of a detector. The circuits are interconnected by a diode across which a discharge transistor is connected. One of the capacitor integrated networks is designed with a much faster time constant than the other such that when holes or intervals are sensed in the received signal information, a bias develops to activate the discharge transistor and thereby prevent a predetermined level of d-c control voltage from developing to initiate a control effect, such as volume or channel change.

5 Claims, 6 Drawing Figures

PATENTED SEP 16 1975

3,906,257

NOISE IMMUNITY CIRCUIT FOR USE WITH REMOTE CONTROL RECEIVER

BACKGROUND OF THE INVENTION

The present invention relates generally to noise-immunization arrangements and in particular to an improved noise-immunity circuit especially suited for use in remote control apparatus associated with television receiver operation.

Remote control devices of one sort or another are, of course, known in the art. The are intended to operate television sets from a remote position as well as other electronic receiver apparatus. For television receiver operation, however, there are essentially two types. One operates by ultrasonic sound waves generated by a mechanical sound generator. That is, a hammer or related control element is caused to strike a precisely tuned cylinder or other sonic resonant contrivance. The resulting sound energy, at a carefully controlled frequency, is then detected in a television receiver and utilized to initiate a suitable control function, such as changing channels, altering sound volume level, or turn-on or turn-off of the receiver apparatus. In its simplest form, such remote control devices for television receiver application utilize two such mechanical sound generators for effecting the desired control functions. One for on/off-volume change, and the other for effecting channel change.

The other type of remote control unit may or may not function by the generation of sound waves. It may transmit electromagnetic energy in substantially the same manner as a conventional radio transmitter. In either case, however, this type of remote control unit generates the control signal electronically as contrasted to merely mechanically for the first referenced type. For those units intended to operate on sound or sonic energy, the carrier signal is generated by a transducer rather than the referenced hammer-anvil arrangement. In any event, the referenced detector cannot distinguish between the ultrasonic sound energy as generated by either of the two systems. The detector either senses the presence of sound energy within the predetermined frequency range, or it does not.

It is precisely this operational characteristic that frequently gives rise to a problem of false operation. That is, the channel and volume controls of the remotely controlled receiver may well be activated in the presence of sound energy no matter how or where generated. That is particularly true with respect to extraneous noise. As is well known noise exhibits relatively broad band characteristics. Accordingly, merely jingling keys or similar objects in the immediate vicinity of the remote controlled television receiver may generate sufficient energy within the particular frequency range of interest to result in false operation.

Accordingly, it is an object of the present invention to provide remote control receiver apparatus for a television receiver which does not falsely activate on extraneous noise while nevertheless providing efficient and reliable operation on receipt of the proper ultrasonic control signal.

A more particular object of the present invention is to provide a noise-immunity circuit for inclusion in the remote control receiver section of a television set so as to effectively prevent false operation on impulse-type noise having a short duration, but rapid repetition rate.

Under certain circumstances, a properly generated ultrasonic signal may take on certain characteristics of extraneous noise. That is, if the remote control unit generating the ultrasonic signal is waved or sufficiently moved about during operation, signal cancellation may well occur acoustically such that "holes" or blank spots will result in the generated control signal. These holes may cause the received control signal at the television receiver to look like noise to the extent that the signal is interrupted and not continuous.

Therefore, it is a further object of the present invention to provide an improved noise-immunity circuit for inclusion in the remote control circuitry of an associated television receiver which not only prevents false operation on impulse-type noise but further discriminates between such noise and a generated ultrasonic control signal, notwithstanding the latter may exhibit interruptions or blank spots therein.

SUMMARY OF THE INVENTION

In practicing the invention, a pair of integration circuits are provided at the output of a detector in a remote control apparatus included as part of an electronic receiver, such as a television set. The referenced integration circuits are suitably interconnected by a diode in parallel with a discharge transistor. The first integration circuit is comprised of a resistance and a capacitor having a relatively short time constant with respect to the second integration circuit, likewise comprising a resistance and a capacitor. The output of the second integration circuit may or may not be coupled to an additional capacitor through a series diode.

Accordingly, should the received signal information be of a short duration, such as exhibited by impulse-type noise, the cessation of the driving signal will result in a bias across the discharge transistor so as to cause it to conduct and rapidly remove the charge from the capacitors in the two integration circuits. On a continuous control signal, however, an appropriate charge level will be reached on the capacitor in the second integration circuit, which may then be utilized to initiate the appropriate control effect or function.

In another embodiment, the charge on the capacitor in the second integration circuit may be coupled to an additional capacitor through a series diode. When the charge level of the third capacitor reaches the predetermined level, the appropriate control function will then be initiated. In this way, the remote control unit discriminates between short duration impulse noise and that of a continuous signal that may be inadvertently interrupted.

BRIEF DESCRIPTION OF THE DRAWINGS

The features of the present invention which are believed to be novel are set forth with particularlity in the appended claims. The invention itself, however, together with further objects and advantages thereof, may best be understood by reference to the following description when taken in conjunction with the accompanying drawings, in which:

Figure 1:
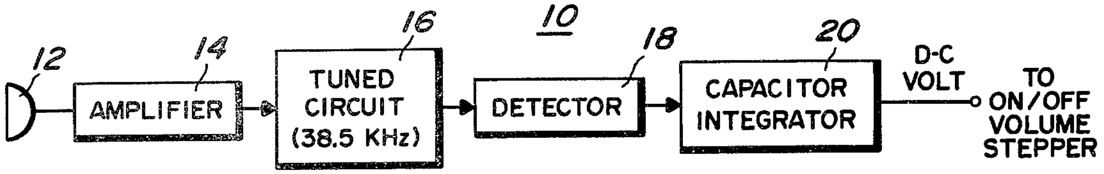
FIG. 1 is a partial block diagram of a remote control transmitter unit that may be considered as typical of the prior art.

Referring now to the drawings, remote control receiving apparatus 10 is represented in partial block diagram form in FIG. 1. As such, it may be considered as conventional in form and typical of the prior art. The remote control 10 is of the type intended for operation with ultrasonic sound energy.

Accordingly, the sound energy may be picked up or received by a microphone pick-up 12, which is then suitably amplified by an amplifier arrangement 14. If the amplified signal is within the pass band range of tuned circuit 16, it is then passed through to a detector stage 18. For purposes of illustration, the frequency of operation is indicated as 38.5 kHz. The energy detected in stage 18 is then applied to a capacitor integrator arrangement, indicated at 20, wherein a suitable d-c control voltage is developed for application, for example, to the on/off-volume stepper of the associated television receiver (not shown). As will be understood to those skilled in the art, an additional tuned circuit, operative at some other frequency, a detector and a capacitor integrator is required to provide an additional d-c control voltage for other functions, such as, for example, changing channels.

As mentioned, the remote control apparatus 10 as depicted in FIG. 1 is entirely conventional and, thus, known in the art. However, a problem of false operation may well occur for such apparatus with respect to noise and/or other extraneous signals. Noise of the impulse type is depicted graphically at N in FIG. 4*a*. It may be generated by any number of sources, such as telephone or door bells, objects, such as keys, striking one another, children's toys, etc. While a characteristic of noise is that it is non-resonant, and thus effects a broadband response, it may nevertheless present sufficient energy in the frequency range of interest so as to cause an undesired control action to take place . . . hence, false operation.

It is to be noted, however, that even though the extraneous noise signal as shown at N does exhibit energy at the referenced frequency of operation, it usually is not continuous. That is, the noise energy is in the form of a series of recurrent bursts with varying intervals in between, as indicated at $X_1$ and $X_2$ in FIG. 4*a*. A properly generated control signal S of ultrasonic energy, on the other hand, is normally of a continuous nature. Those signals developed by a mechanical sound generator may decrease in amplitude in the manner as depicted in FIG. 4*b*, but the signal information is nevertheless continuous in nature, under normal circumstances.

Figure 2:
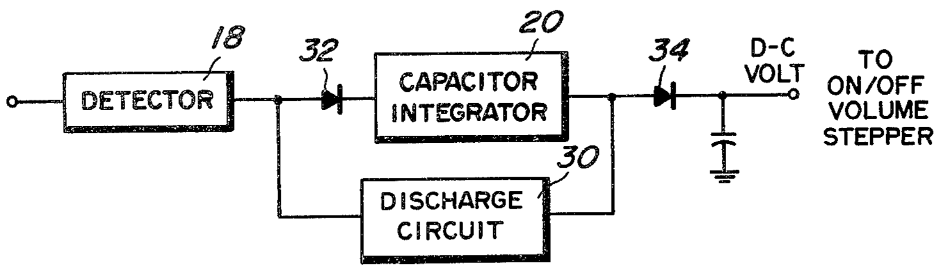
FIG. 2 is a partial block and schematic representation of an improvement therein so as to provide substantial immunity from false operation in the presence of short duration, impulse-type noise.
Figure 4:
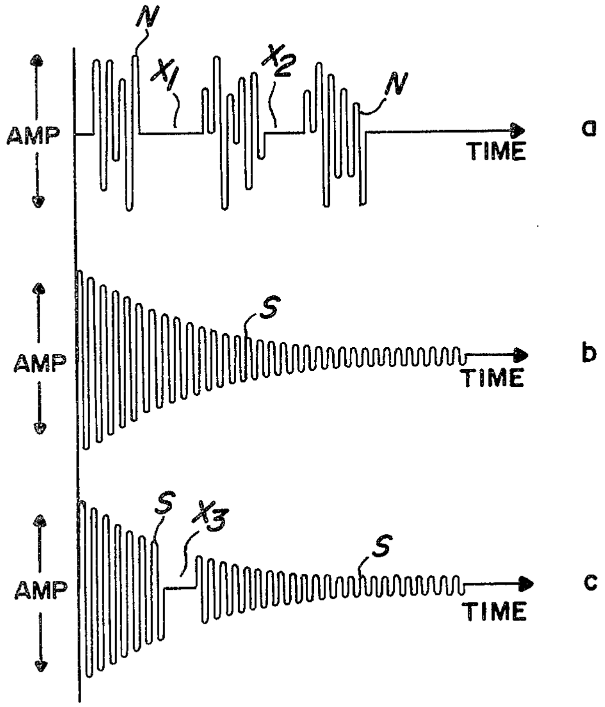
FIGS. 4*a* through 4*c* are various waveform representations useful in understanding certain important aspects of the present invention.

It is precisely these differing characteristics between impulse noise signal information and a correctly generated ultrasonic control signal that provides a solution to such false operation by virtue of the present invention. As will be observed in FIG. 2, a separate discharge circuit 30 is provided in parallel with the capacitor integrator 20 at the output of the detector 18. The purpose of the diodes 32 and 34 will become apparent subsequently. Accordingly, if the discharge circuit 30 is made responsive to any blank intervals or interruptions in the received signal information, only control signals as depicted at S in FIG. 4 will be acted upon by the integrator 20 to initiate and develop a d-c control voltage for activation of a suitable control element, such as the indicated on/off volume stepper. The developed d-c control voltage, of course, could be utilized to activate a channel changer as well. In any event, the reception of an impulse noise signal as depicted in FIG. 4a will not permit the development of a d-c control voltage to initiate control actions because the discharge circuit is activated upon the occurrence of a blank spot or interval, such as represented by $X_1$ or $X_2$, FIG. 4a, to discharge the capacitor integrator 20 of any stored energy.

Figure 3:
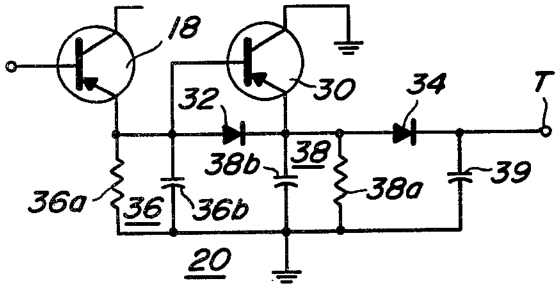
FIG. 3 is a partial schematic of the noise-immunity circuitry effecting the improved operation.

The circuitry for affecting this is shown schematically in FIG. 3. The capacitor integrator 20 consists essentially of a pair of integration circuits 36 and 38, each consisting of a resistance 36*a* or 38*a* and a capacitor 36*b* or 38*b*. The detector is shown as a transistor 18 having a base-input, a collector and an output-emitter coupled to a terminal common to integration circuit 36, diode 32 and a base-input of a further transistor 30. Transistor 30, of course, serves as the discharge device and includes an emitter connected to the other side of diode 32 common to integration circuit 38 and also a collector connected directly to ground. A further diode 34 may be interposed between integration circuit 38 and an output terminal T. A further capacitor 39 is connected from terminal T to ground.

In operation, the values of resistance 36*a* and capacitor 36*b* are selected so as to provide a relatively short time constant for integration circuit 36 as compared to that of integration 38, as effected by the values selected for resistance 38*a* and capacitor 38*b*. Accordingly, as a control signal S of the type depicted in FIG. 4*b* is received and applied to the base-input of detector 18, a voltage appears at the emitter thereof and capacitor 36*b* is caused to charge up. As the voltage rises to above 0.7 volts, the threshold of diode 32 is reached and current is conducted therethrough to begin to charge up capacitor 38*b* as well. As will be appreciated, the overall charging time is lengthened by the addition of capacitor 38*b* as compared to that of with capacitor 36*b* alone. However, the respective values are such that capacitor 39 does not appreciably affect the charging time when added to the charging circuit by the conduction of diode 34. It has been found that the following component values provide satisfactory operation:

| | | |
|---|---|---|
| resistance | 36*a* | 10,000 ohms |
| resistance | 38*a* | 1,000 ohms |
| capacitor | 36*b* | 0.022 microfarads |
| capacitor | 38*b* | 47.0 microfarads |
| capacitor | 39 | 1.5 microfarads |

When the charge on capacitor 39 reaches a predetermined level of magnitude, the appropriate control action may then be initiated or triggered. The effective control action level will not be reached, however, in the presence of the noise signal as referenced at N in FIG. 4*a*. This is because that as soon as the driving waveform is removed or vanishes, such as at the referenced intervals $X_1$ or $X_2$, the integration circuits 36 and 38 immediately begin to discharge. However, since the time constant of resistance 36*a* - capacitor 36*b* is much faster than that of resistance 38*a* - capacitor 38*b*, the base-input of discharge transistor 30 becomes more negative with respect to its emitter. When the voltage differential exceeds the 0.7 volt threshold value of diode 32, transistor 30 becomes conductive to rapidly discharge both capacitors 36*b* and 38*b*. Accordingly, the triggering level is never reached to initiate the referenced control action, such as activation of the volume stepper or channel changer.

It might be mentioned at this point that diode 34 and capacitor 39 are included to insure proper operation notwithstanding cancellations may occur acoustically in the received signal, which then takes on certain of the aspects of extraneous noise signal information. It has been observed that when using either the all electronic remote control unit or one utilizing the aforementioned mechanical sound generators, that by waving the unit about while and during the time the ultrasonic signal is being generated, certain cancellations may occur which result in holes appearing in the control signal itself, such as indicated in $X_3$ in FIG. 4*c*. These holes or blank spots may well cause the activation of the discharge transistor 30 in the same manner as previously described in the presence of impulse-type noise. The result is that multiple triggerings will then occur due to a rapidly fluctuating triggering voltage at the output terminal T.

However, with diode 34 and capacitor 39 effectively in the circuit, such multiple triggerings cannot take place. This is because even though capacitor **38*b* may still be discharged as a result of intervals or holes occurring in the signal information, diode 34 nevertheless prevents capacitor 39 from being likewise discharged through transistor 30. Capacitor 39 can only be discharged through the resistive discharge path in the on/-off volume stepper circuitry (not shown). It is to be noted that diode 34 and capacitor 39** may be required where the control action is to be one of changing channels. This is because a relay is customarily used in this instance and a latching (d-c) voltage is applied thereto. In other words, the required extra time constant to prevent multiple triggerings is effected mechanically.

While a particular embodiment of the invention has been shown and described herein, it will be obvious to those skilled in the art that various modifications and alternative constructions may be made without departing from the true scope and spirit of the present invention in its broader aspects, and, therefore, the aim in the appended claims is to cover all such changes and modifications as may fall within the true spirit and scope of the present invention.

What is claimed is:

1. A noise immunization circuit for use with a detector responsive to input signals for initiating a control effect, comprising in combination:

first integrator circuit means coupled with the detector for developing a first direct current control voltage in response to signals received by said detector;

impedance means;

second integration circuit means having a time constant which is long relative to the time constant of said first integration circuit means coupled with said first integration circuit means through said impedance means;

discharge circuit means coupled across said impedance means and rendered conductive in response to a predetermined voltage relationship across said impedance means to remove stored energy in said second integration circuit means whenever interruptions appear in the detected signal as occur in short duration impulse type noise signal information.

2. The combination according to claim 1 wherein said impedance means comprises diode means poled for forward conduction in a first direction and said discharge circuit means comprises a transistor, the base-emitter circuit of which is connected across said diode means and poled for forward conduction in a direction opposite to the forward conduction direction of said diode means, the collector of said transistor being coupled with a point of reference potential.

3. The combination according to claim 2 wherein the anode of said diode means is connected with said first integration circuit means, the cathode of said diode means is connected with said second integration circuit means; and said transistor comprises a PNP transistor, the base of which is coupled with the anode of said diode means, the emitter of which is coupled with the cathode of said diode means, and the collector of which is coupled to ground.

4. Improved noise-immunization circuitry in accordance with claim 1 wherein said first and second integration circuits are each formed of a resistance element and a capacitance element of selected value.

5. Improved noise-immunization circuitry in accordance with claim 4 wherein a further capacitance element is connected in parallel with said second integration circuit through a further diode means.

* * * * *